(12) United States Patent
Tabata et al.

(10) Patent No.: US 8,857,371 B2
(45) Date of Patent: Oct. 14, 2014

(54) APPARATUS FOR GENERATING DIELECTRIC BARRIER DISCHARGE GAS

(75) Inventors: Yoichiro Tabata, Tokyo (JP); Kensuke Watanabe, Tokyo (JP)

(73) Assignee: Toshiba Mitsubishi-Electric Industrial Systems Corporation, Tokyo (JP)

( * ) Notice: Subject to any disclaimer, the term of this patent is extended or adjusted under 35 U.S.C. 154(b) by 1135 days.

(21) Appl. No.: 12/668,886

(22) PCT Filed: Aug. 31, 2007

(86) PCT No.: PCT/JP2007/066990
§ 371 (c)(1),
(2), (4) Date: Jan. 13, 2010

(87) PCT Pub. No.: WO2009/028084
PCT Pub. Date: Mar. 5, 2009

(65) Prior Publication Data
US 2010/0193129 A1    Aug. 5, 2010

(51) Int. Cl.
*C23C 16/00*        (2006.01)
*C23C 16/50*        (2006.01)
*C23F 1/00*         (2006.01)
*H01L 21/3065*      (2006.01)
*C23C 16/505*       (2006.01)
*H01J 37/32*        (2006.01)

(52) U.S. Cl.
CPC ......... *C23C 16/505* (2013.01); *H01J 37/32724* (2013.01); *H01J 37/32348* (2013.01); *H01J 37/32009* (2013.01)
USPC ............. 118/723 ER; 118/723 E; 118/723 R; 156/345.43; 156/345.47

(58) Field of Classification Search
None
See application file for complete search history.

(56) References Cited

U.S. PATENT DOCUMENTS

| 4,693,870 A | 9/1987 | Gloor et al. |
|---|---|---|
| 5,376,212 A * | 12/1994 | Saiki .................. 156/345.31 |

(Continued)

FOREIGN PATENT DOCUMENTS

| DE | 112006002127 | * | 3/2008 |
|---|---|---|---|
| JP | 10-212106 A | | 8/1998 |

(Continued)

OTHER PUBLICATIONS

H.-E. Wagner et al., "The barrier discharge: basic properties and applications to surface treatment," Vacuum 71 (2003) pp. 417-436.*

(Continued)

*Primary Examiner* — Jeffrie R Lund
*Assistant Examiner* — Stanislav Antolin
(74) *Attorney, Agent, or Firm* — Leydig, Voit & Mayer, Ltd.

(57) ABSTRACT

An apparatus for generating a dielectric-barrier discharge gas including a high-energy radical gas, at a high density and with high efficiency. A flat-plate-like first electrode and a flat-plate-like second electrode are arranged in opposite positions, and a dielectric body is arranged between the two electrodes. A discharge space is located between the first electrode and the dielectric body, within a gap between the first electrode and the dielectric body. The discharge space has three sides which are gas shielded and a fourth side which opens to end surfaces of the first electrode and the dielectric body. A cooling section cools at least the first electrode and a gas supply section supplies a raw material gas to the discharge space part. A dielectric-barrier discharge is generated in the discharge space part by applying an AC voltage to the first electrode and the second electrode.

12 Claims, 8 Drawing Sheets

(56) References Cited

U.S. PATENT DOCUMENTS

| | | | |
|---|---|---|---|
| 5,538,695 A | 7/1996 | Shinjo et al. | |
| 6,664,737 B1 * | 12/2003 | Berry et al. | 315/111.21 |
| 6,670,766 B2 * | 12/2003 | Yamazaki et al. | 315/111.21 |
| 6,919,107 B2 * | 7/2005 | Schwarzenbach et al. | 427/569 |
| 7,056,416 B2 * | 6/2006 | Okumura et al. | 156/345.37 |
| 7,514,377 B2 * | 4/2009 | Sato et al. | 438/798 |
| 7,644,680 B2 * | 1/2010 | Ho | 118/723 E |
| 7,662,253 B2 * | 2/2010 | Yoon et al. | 156/345.43 |
| 2002/0000202 A1 * | 1/2002 | Yuda et al. | 118/723 ER |
| 2003/0095899 A1 * | 5/2003 | Okihara et al. | 422/186.07 |
| 2004/0052701 A1 * | 3/2004 | Okihara et al. | 422/186.07 |
| 2004/0076560 A1 * | 4/2004 | Tabata et al. | 422/186.07 |
| 2005/0272198 A1 | 12/2005 | Hamamura et al. | |
| 2005/0279458 A1 * | 12/2005 | Okumura et al. | 156/345.47 |
| 2006/0196424 A1 * | 9/2006 | Swallow et al. | 118/723 E |
| 2007/0137569 A1 * | 6/2007 | Ho | 118/723 E |
| 2009/0152097 A1 * | 6/2009 | Eichler et al. | 204/164 |

FOREIGN PATENT DOCUMENTS

| | | |
|---|---|---|
| JP | 2003-36996 A | 2/2003 |
| JP | 2003-142482 A | 5/2003 |
| JP | 2004-115896 A | 4/2004 |
| JP | 2004-203741 A | 7/2004 |
| JP | 2005-347679 A | 12/2005 |
| JP | 2006-515708 A | 6/2006 |
| JP | 2006-319192 A | 11/2006 |
| JP | 2006319192 A * | 11/2006 |
| WO | WO 98/19961 A2 | 5/1998 |
| WO | 2007017271 A2 * | 2/2007 |

OTHER PUBLICATIONS

March Plasma Systems, "Plasma Modes: Primary and Secondary Plasmas," Application Note: PLL-03-2826 Rev. A (2003) pp. 1-2 (March Plasma Systems, 4057 Port Chicago Highway, Concord, CA 94520).*

Ulrich Kogelschatz, "Dielectric-barrier Discharges: Their History, Discharge Physics, and Industrial Applications," Plasma Chemistry and Plasma Processing, vol. 23, No. 1, Mar. 2003 pp. 1-46.*

Ren Zhongfu et al., "Continuous Modification Treatment of Polyester Fabric by Ar—O2 (10:1) Discharge at Atmospheric Pressure," Journal of Industrial Textiles Jul. 2007; vol. 37, 1 (2007) pp. 43-53.*

* cited by examiner

APPARATUS FOR GENERATING DIELECTRIC BARRIER DISCHARGE GAS

TECHNICAL FIELD

The present invention relates to an apparatus for generating a dielectric-barrier discharge gas and, more particularly, to an apparatus for generating a dielectric-barrier discharge gas which supplies oxygen, an oxygen compound gas, ozone gas, nitrogen gas, a nitrogen compound gas and the like to a discharge void part and causes a dielectric-barrier discharge (a silent discharge) to be generated via a dielectric body by applying an AC voltage across a high-voltage electrode and a low-voltage electrode, thereby making it possible to effectively take out a radical gas (an excitation gas) generated by a discharge in a high electric field.

BACKGROUND ART

Oxygen-species and nitrogen-species ions and radical gases have a very high reactivity with substances to be treated and can become means for obtaining good-quality oxide films and nitrogen films. For this reason, oxygen-species and nitrogen-species ions and radical gases are attracting attention as thin film forming means which forms insulating films in the semiconductor field and thin film forming means which improves wear resistance and corrosion resistance of working tools and the like at high temperatures. However, ions and radical gasses are very unstable and have very short life. For this reason, generated ions and radical gases often disappear before they initiate reactions with substances to be treated, thereby posing the problem that effective use of generated ions and radical gases is difficult.

The following two methods are generally known as methods of generating ions and radical gases. One is a method which involves supplying a stable molecular gas, such as oxygen gas, an oxygen compound gas, ozone gas, nitrogen gas, and a nitrogen compound gas, to a reactor, and causing the gas to discharge directly in this reactor, thereby generating ions and radical gases, what is called the discharge plasma process. The other is a method of irradiating gas with laser light and ultraviolet light or thermally decomposing a molecular gas and causing the gas to absorb light energy or heat energy, thereby generating a radical gas, what is called the light/heat absorption process.

Examples of the above-described discharge plasma process include PECVD (plasma enhanced chemical vapor deposition) process and the ion plating process. In each discharge plasma process, a high-frequency plasma and a glow discharge at low gas pressures of the order of several tens of pascals (Pa) to several thousands of pascals (Pa) are used as the discharge.

In the PECVD process and the ion plating process, a radical gas is generated by using a high-frequency plasma of the order of 2.45 GHz and a low-pressure glow discharge by the application of DC voltage. Also, a plasma is generated directly on a substrate surface, which is a substance to be treated, and an oxide thin film and a nitrogen thin film are formed by an ion gas or a radical gas in the plasma. For this reason, it is possible to bring large amounts of ion gas and radical gas species into contact with the substance to be treated, and this provides the advantage that high film forming speeds and large film thicknesses can be obtained.

On the other hand, the optical CVD process described in Patent Document 1 and the thermal CVD process described in Patent Document 2 are proposed as a generation method and a utilization method of radical gases by the light/heat absorption process.

In the optical CVD process described in Patent Document 1, a gas of a molecule having nitrogen plasma atoms having low gas pressures of the order of several hundreds of Pa to several thousands of Pa is irradiated with ultraviolet light having an optical energy of the order of several eV to ten-odd eV, whereby a nitrogen radical ($N(^2D)$, $N(^2P)$) gas in a doublet state or a nitrogen radical ($N(^4S)$) gas in a quartet state is generated. And the above-described nitrogen gas species is brought into contact with a substrate surface on which an oxide thin film is formed and which is heated to several hundreds of degrees, thereby the nitrogen thin film is formed.

In the thermal CVD process described in Patent Document 2, after the formation of a silicon nitride insulating film by forming a silicon nitride film on a semiconductor surface, an oxide film having a film thickness of the order of several nm is formed on this silicon nitride insulating film by dry oxidation. Incidentally, this dry oxidation is performed by installing a wafer (a substance to be treated) heated to several hundreds of degrees in a CVD chamber kept at low gas pressures of the order of several hundreds of Pa to several thousands of Pa and blowing ozone gas onto this wafer surface. That is, the ozone gas blown onto the wafer surface is thermally decomposed into an oxygen radical gas on the wafer surface. This oxygen radical gas comes into contact with silicon, which is the wafer surface, and a good-quality silicon oxide film having a film thickness of the order of several nm is formed.

Incidentally, in order to form a good-quality silicon oxide film by the above-described dry oxidation, it is necessary that the wafer surface be heated to approximately 850° C. However, if the temperature of the wafer surface becomes too high, the oxygen radical gas generated by thermal decomposition strikes against a neutral gas in the chamber before coming into contact with the wafer surface and returns to oxygen molecules. For this reason, the amount of the oxygen radical gas which comes into contact with the wafer surface decreases extremely, and it becomes impossible to obtain a prescribed oxide film thickness. Patent Document 2 describes that in order to ensure an oxygen radical gas necessary for obtaining a prescribed film thickness, an ozone gas concentration of not less than 20 vol % (430 g/m$^3$) is necessary. Incidentally, it is generally said that oxygen radicals of a triplet oxygen radical ($^3P$) gas and a singlet ($^1D$) oxygen radical gas are obtained when ozone gas is decomposed.

Patent Document 1: Japanese Patent Laid-Open No. 2003-142482

Patent Document 2: Japanese Patent Laid-Open No. 2005-347679

DISCLOSURE OF THE INVENTION

Problems to be Solved by the Invention

As described above, various kinds of apparatus for generating ions and radical gases have hitherto been developed. However, in the PECVD process and the ion plating process, because the substrate surface is exposed directly to a plasma, this posed the problem that in forming an oxide thin film and a nitride thin film, which are formed from an insulating film, as protective films on the semiconductor surface, the performance of a semiconductor is deteriorated thereby (by plasma damage). That is, in forming an oxide thin film or a nitrogen thin film, the semiconductor surface is electrically charged with charges of electrons and ions in the plasma, with the result that ion conduction occurs between the semiconductor surface and the metal surface and that metal particles migrate to the semiconductor surface by this ion conduction.

The optical CVD process described in Patent Document 1 and the thermal CVD process described in Patent Document 2 had the problem that although good-quality oxide thin film and nitride thin film were obtained, the film forming speed was very slow. Furthermore, in the optical CVD process it is necessary to use ultraviolet light and laser light having high energy and, therefore, apparatus provided with a light source become very expensive, resulting in high cost of the whole system. Furthermore, the optical CVD process also had the problem that when a hydrogen compound gas whose bonding strength of molecules is relatively small was used as a molecular gas for obtaining radical gas species in order to increase the film forming speed, hydrogen entered the oxide thin film and the nitrogen thin film, reducing the quality of the thin film. On the other hand, in the thermal CVD process, in order to increase the film forming speed, it is necessary to raise the concentration of ozone gas, which is an oxygen radical source.

Incidentally, as described above, a radical gas has a very short life. For this reason, it was very difficult to generate a radical gas in a large amount and also it was difficult to cause a radical gas to strike against the treatment surface (the substrate surface) effectively.

The object of the present invention is to provide an apparatus for generating a dielectric-barrier discharge gas which enables the above-described conventional problems to be solved and can take out a high-energy radical gas at a high density and with a high efficiency and supply the radical gas to a substance to be treated.

Means for Solving the Problems

An apparatus for generating dielectric-barrier discharge gas of the present invention is an apparatus for generating dielectric-barrier discharge gas, which comprises a flat-plate-like first electrode, a flat-plate-like second electrode whose one surface is arranged in a position opposite to one surface of the first electrode, a dielectric body which is provided between the first electrode and the second electrode and whose one surface is opposed to the one surface of the first electrode with a prescribed small gap, a cooling section which cools the one surface of the first electrode, a discharge space forming section that is provided between the first electrode and the dielectric body and that forms a discharge space part, whose three sides are gas shielded and the remaining one side of which opens to each end surface side of the first electrode and the dielectric body, within the gap sandwiched between the one surface of the first electrode and the one surface of the dielectric body, a gas supply section which supplies a raw material gas to the discharge space part, and an AC power source which causes a dielectric-barrier discharge to be generated in the discharge space part by applying an AC voltage across the first electrode and the second electrode.

Effect of the Invention

According to the present invention, it is possible to solve the above-described conventional problems and it becomes also possible to take out a high-energy radical gas at a high density and with a high efficiency and to supply the radical gas to a substance to be treated.

BRIEF OF DESCRIPTION OF THE DRAWINGS

DESCRIPTION OF SYMBOLS 1 grounding electrode (first electrode),
1a stainless steel plate, 1b stainless steel plate,
2 high-voltage electrode (second electrode),
3 dielectric body,
4 spacer (a discharge space forming section),
5 raw material gas, 6 gas passage, 6a inlet,
6b outlet, 7 cooling water,
8 cooling water passage, 8a inlet, 8b outlet,
9 spacer, 10 dielectric body,
11 high-voltage electrode, 12 discharge cell,
13 main body, 13a one side wall,
13b gas hole, 14 gas ejection hole,
15 radical gas, 16 AC power source,
17 exhaust pipe, 18 gas pressure detector,
19 exhaust gas controller,
20 microdischarge space column,
21a oxygen cylinder, 21b nitrogen cylinder,
22a gas regulator, 22b gas regulator,
23a MFC, 23b MFC, 24 ozone generator,
25 APC, 26a pneumatic valve,
26b pneumatic valve, 27 reaction chamber,
28 substance to be treated, 29 exhaust regulating valve,
30 exhaust gas decomposing device, 31 inlet,
32 inlet, 33 electrode cell,
34 electrode stack module

BEST MODE FOR CARRYING OUT THE INVENTION

The present invention will be described in more detail with reference to the accompanying drawings. Incidentally, in each of the drawings, like numerals refer to like or similar parts and overlaps of description of these parts are appropriately simplified or omitted.

First Embodiment

Figure 1:
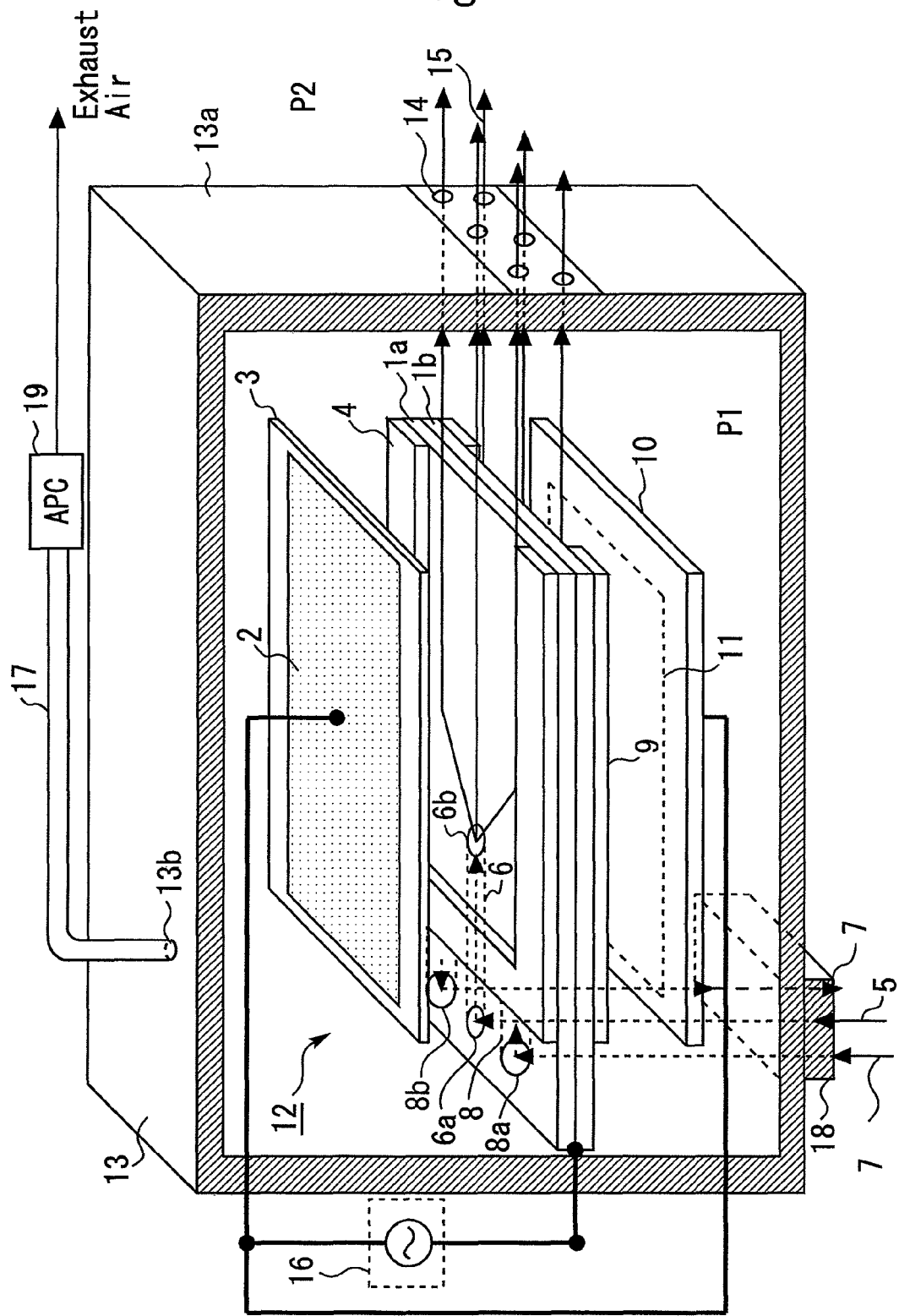
FIG. 1 is a block diagram showing an apparatus for generating a dielectric-barrier discharge gas in First Embodiment according to the present invention.

FIG. 1 is a block diagram showing an apparatus for generating a dielectric-barrier discharge gas in First Embodiment according to the present invention. In FIG. 1, reference numeral 1 denotes a flat-plate-like grounding electrode (first electrode) having the shape of a rectangle. This grounding electrode 1 is fabricated by stacking two flat-plate-like stainless steel plates 1a and 1b together and joining them. Reference numeral 2 denotes a flat-plate-like, high-voltage electrode (second electrode) whose one surface is arranged in a position opposite to one surface of the stainless steel plate 1a, and reference numeral 3 denotes a dielectric body formed from a ceramic plate, a glass plate and the like and provided between the grounding electrode 1 and the high-voltage electrode 2.

Reference numeral 4 denotes a spacer (a discharge space forming section) provided between the grounding electrode 1 and the dielectric body 3. Incidentally, to facilitate explanation, the dielectric body 3 and the spacer 4 are drawn in separate positions in FIG. 1. In actuality, however, the grounding electrode 1, the spacer 4, the dielectric body 3 and the high-voltage electrode 2 are stacked together in this order and are formed in layers. That is, because the spacer 4 is arranged between the grounding electrode 1 and the dielectric body 3, the dielectric body 3 is such that one surface thereof is opposed to the above-described surface of the stainless steel plate 1a with a prescribed gap.

By arranging the above-described spacer 4 between the grounding electrode 1 and the dielectric body 3, the spacer 4 forms the above-described gap between one surface of the stainless steel plate 1a and one surface of the dielectric body 3 and simultaneously forms, within this gap, a discharge space part whose three sides are gas shielded and the remaining one side of which opens to the side of one end surfaces of the grounding electrode 1 and the dielectric body 3. For example, the spacer 4 is formed from a U-shaped plate-like member, and forms, in this U-shaped portion, the rectangular discharge space part having the thickness of the above-described plate-like member. Incidentally, as shown in FIG. 1, it becomes possible to ensure a wider discharge space part by arranging part of the spacer 4 along at least two edge portions of the grounding electrode 1.

This apparatus for generating a dielectric-barrier discharge gas is provided with a gas supply section which supplies a raw material gas 5 to the above-described discharge space part and a cooling section which cools one surface of the stainless steel plate 1a. FIG. 1 shows, as an example, a case where part of the above-described gas supply section and part of the cooling section are formed within the grounding electrode 1. That is, the two stainless steel plates 1a and 1b which constitute the grounding electrode 1 are such that unnecessary portions are removed beforehand from the jointed surfaces by half etching and the like. And the grounding electrode 1 is such that the stainless steel plates 1a and 1b are stacked together, whereby in the interior of the grounding electrode 1, there are formed a gas passage 6 through which the raw material gas 5 passes and a cooling water passage 8 through which cooling water 7 passes (for an outline of the gas passage 6 and the cooling water passage 8, refer to Japanese Patent No. 3607905).

Incidentally, reference numerals 6a and 6b denote an inlet and an outlet of the gas passage 6 formed in the grounding electrode 1, and reference numerals 8a and 8b denote an inlet and an outlet of the cooling water passage 8 formed in the grounding electrode 1. The inlet 6a of the gas passage 6 and the inlet 8a and outlet 8b of the cooling water passage 8 are formed side by side in a portion of another end of the grounding electrode 1 on the opposite side of a portion of one end where the opening of the discharge space part is formed. On the other hand, the outlet 6b of the gas passage 6 is formed on one surface of the stainless steel plate 1a in the discharge space part. That is, the raw material gas 5 flows from the inlet 6a into the grounding electrode 1, passes through the gas passage 6, and is supplied from the outlet 6b into the discharge space part. The cooling water 7 is supplied from the inlet 8a into the grounding electrode 1, passes through the cooling water passage 8 formed throughout the whole range of the discharge space part, and is drained from the outlet 8b. Incidentally, the cooling water 7 is supplied to the interior of the grounding electrode 1 in order to lower the gas temperature in the discharge space part, and when a further cooling function is necessary, a cooling water passage is formed also in the high-voltage electrode 2, for example, and the cooling water 7 is supplied.

Although the foregoing is the configuration of the grounding electrode 1 on the stainless steel plate 1a side, as shown in FIG. 1, also the configuration on the stainless steel plate 1b side is similar to the configuration of the grounding electrode 1 on the stainless steel plate 1a side. That is, a spacer 9, a dielectric body 10, and a high-voltage electrode 11 are stacked together on the side of one surface of the stainless steel plate 1b, and a discharge space part is formed by the spacer 9 within a gap formed between the stainless steel plate 1b and the dielectric body 10. As a result of this, a discharge cell 12 in which the discharge space part is formed on both sides of the grounding electrode 1 is configured.

The whole of the above-described discharge cell 12 is covered with a main body 13. This main body 13 is arranged in proximity to an opening of the discharge space part so that one side wall 13a of the main body 13 is opposed to this opening. The main body 13 has a plurality of gas ejection holes 14, which are formed on the above-described one side wall 13a and are arranged in positions opposite to the opening. The gas ejection holes 14 are intended for taking out a radical gas 15 generated in the discharge space part and ejected from the opening into the main body 13 (details will be described later) to outside the main body 13, and the direction of holes is set according to the direction in which the above-described radical gas 15 is ejected from the opening of the discharge space part.

Reference numeral 16 denotes a high-frequency AC power source. Although not shown in the figure, the AC power source 16 is mainly composed of a converter section, an inverter section, and a transformer section. And the AC power source 16 causes a dielectric-barrier discharge (a silent discharge) of a uniform high electric field to be generated on the whole surface of the discharge space part by applying an AC high voltage (for example, 3 kV, 10 kHz) via the dielectric body 3 (and the dielectric body 10) across the grounding electrode 1 and the high-voltage electrode 2 (and the high-voltage electrode 11).

This apparatus for generating a dielectric-barrier discharge gas has the function of maintaining the pressure in the main body 13 at a constant value. Concretely, a gas hole 13b is formed in a wall surface other than the above-described one side wall 13a of the main body 13 (the ceiling surface in FIG. 1). A exhaust pipe 17 is connected to the above-described wall surface in order to exhaust gas in the main body 13 via this gas hole 13b. Furthermore, a gas pressure detector 18 for detecting the gas pressure in the main body 13 is installed, for example, in the main body 13 or in a pipe section for supplying the raw material gas 5 to the main body 13. And an exhaust gas controller 19 (APC: automatic pressure controller) controls a small flow rate of gas exhausted from within the main body 13 on the basis of a gas pressure detected by the gas pressure detector 18, and thereby maintains the gas pressure in the main body 13 to a prescribed constant value higher than the pressure outside the main body 13.

Next, features of the apparatus for generating a dielectric-barrier discharge gas having the above-described configuration will be concretely described in comparison with a conventional plasma generator.

When a dielectric body is provided between parallel electrodes and an AC high voltage is applied across the two electrodes, a high-electric-field, dielectric-barrier discharge is generated via the dielectric body. In such a discharge, a gas in the discharge region comes to a plasma state in which the gas is separated into electrons and ions. In this discharge plasma, the electrons are accelerated by the discharge electric field and obtain high energy. And an excitation gas having a high energy (a radical gas) and ionized charged particles (ion particles) are generated by the collision of the high-energy electrons against the gas molecules.

That is, it can be said that a discharged plasma gas is a gas in which electrons, ion particles, and a high-energy radical gas are present in a mixed condition. Incidentally, the energy Ep possessed by the electrons, ion particles and radical gas in a discharged plasma is expressed by the following expression.

$$Ep \propto E/n \propto E/P \quad \text{[Expression 1]}$$

In this expression, E is the electric field in a plasma (V/cm), n is the gas density in the plasma (particle/cm$^3$), and P is the gas pressure in the plasma (Pa). That is, the energy Ep depends on the frequency of energy giving and receiving by electrons which are accelerated by the discharge electric field E and collide against gas particles. Incidentally, as is apparent from Expression 1 above, the larger the electric field E in the plasma and the smaller the gas density n (the gas pressure (p)), the higher the energy of the plasma which can be obtained.

Also, there is available E/P (V·cm$^2$) as a value for evaluating the energy Ep in a plasma. Incidentally, this shows that the larger the E/P value of a plasma state, the higher the energy of the plasma. In general, the plasma state of a discharge is evaluated by E/P (Td). In this expression, 1 Td=1×10$^{-17}$ (V·cm$^2$).

When high-energy electrons, ion gas and a radical gas generated by a discharge plasma collide against a substance to be treated, a chemical reaction is promoted on the collision surface (contact surface) by the collision, with the result that it becomes possible to form an oxide film, a nitride film, a surface modification film (an annealing film) or a uniquely etched substrate.

Figure 2:
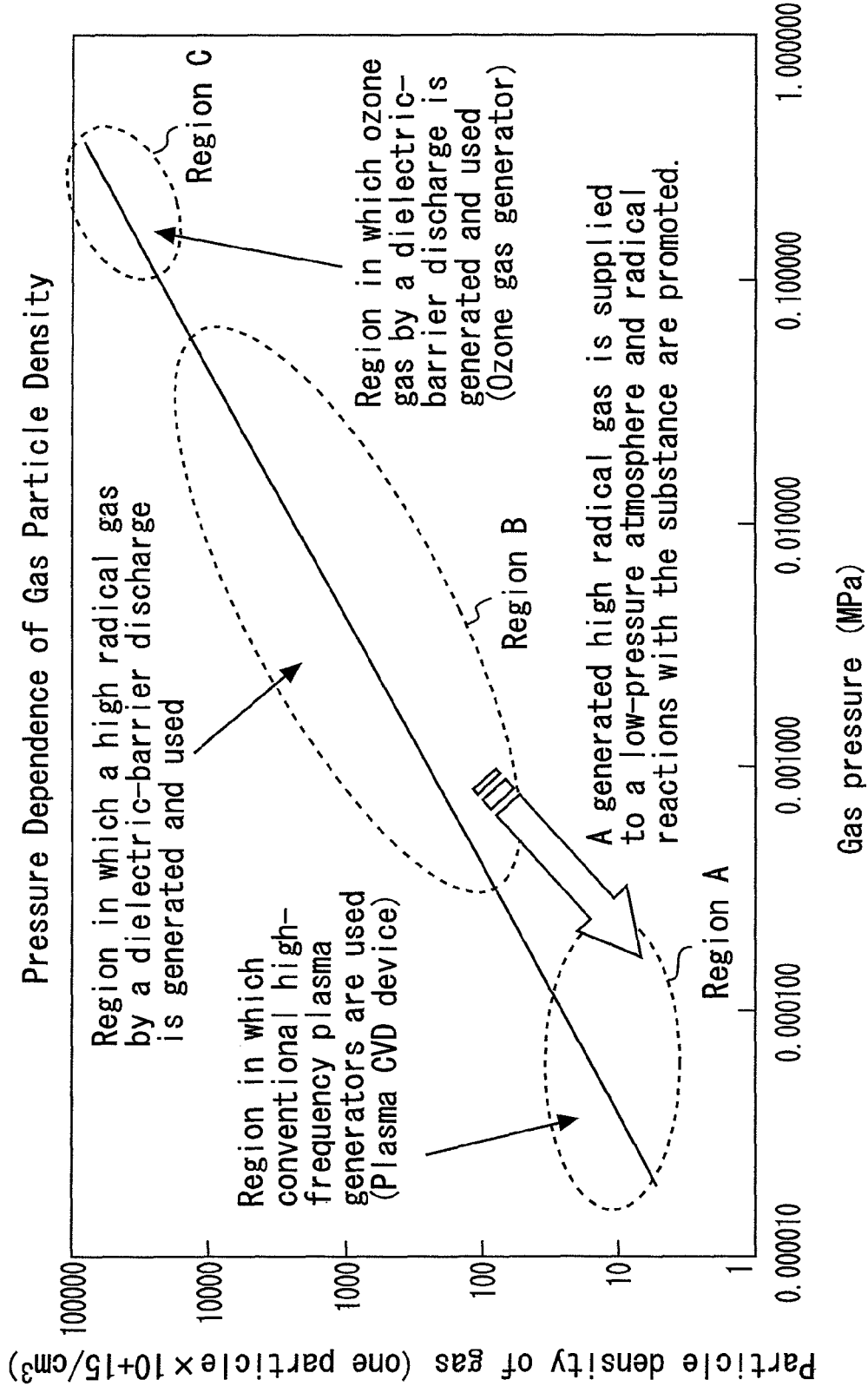
FIG. 2 is a diagram showing the gas particle density characteristics per unit area of plasma-using apparatus relative to gas pressure.

FIG. 2 is a diagram showing the gas particle density characteristics per unit area of plasma-using apparatus relative to gas pressure, and shows in what particle density region the apparatus using a discharge are used. In FIG. 2, Region C is a region suitable for rebinding particles dissociated by a discharge by forming a high-density plasma, that is, for generating a gas polymerized from a raw material gas.

As an apparatus using a plasma in Region C, there is available, for example, an ozone gas generator. In this ozone gas generator, a high-pressure plasma having gas pressures of not less than 0.1 MPa is generated by a dielectric-barrier discharge or a creeping discharge, and ozone gas is generated from oxygen gas and the like. That is, an oxygen atomic gas dissociated by a chemical reaction of plasma light and a photocatalytic substance with a raw material gas is rebound by a three-body collision, whereby ozone gas is generated. Incidentally, in order to increase the amount of ozone to be generated, it is necessary to promote the above-described three-body collision by dissociated particles. For this purpose, as the particle density, high densities of not less than 10$^{10}$ (particles/cm$^3$) are effective.

On the other hand, a plasma CVD device uses surface chemical reactions by high-energy electrons, ions and particles. For this reason, in a plasma CVD device, a low-pressure plasma having very low gas densities of not more than 0.0005 MPa, from which high-energy particles can be obtained relatively easily, is generated by a micro-wave discharge, a high-frequency discharge and a low-pressure glow discharge. And a thin film having excellent functionality is formed on the semiconductor surface by causing a generated plasma to strike against the wafer (Region A).

Figure 3:
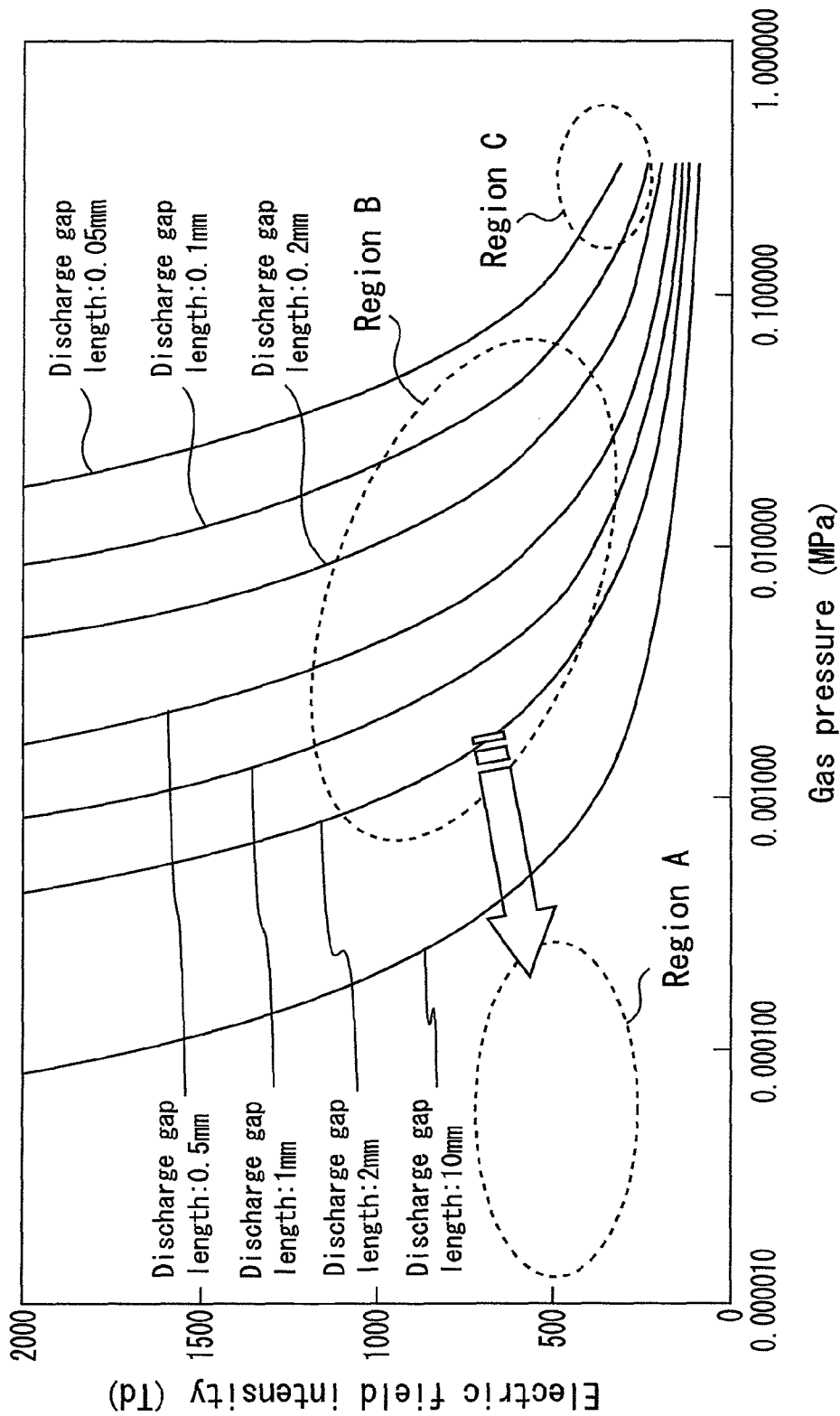
FIG. 3 is a diagram showing the electric field intensity characteristics of plasma-using apparatus relative to gas pressure.

FIG. 3 is a diagram showing the electric field intensity characteristics of plasma-using apparatus relative to gas pressure, and shows plasmas of what electric field intensity are used in discharge-using apparatus. In FIG. 3, in Region C used by an ozone gas generator, a dielectric-barrier discharge having electric field intensities of not less than 100 Td is realized by setting the gas pressure at not less than 0.1 MPa and the discharge gap length for obtaining a plasma at not more than 0.2 mm, whereby high-concentration ozone gas is generated.

On the other hand, in Region A used by a plasma CVD device, a low-pressure plasma having very low gas densities of not more than 0.0005 MPa is generated by a micro-wave discharge, a high-frequency discharge and a low-pressure glow discharge, whereby a high-electric-field plasma having electric field intensities of 300 to 600 Td is generated and high-energy particles in the plasma are obtained.

In contrast to this, in the apparatus for generating a dielectric-barrier discharge gas of the present invention, a plasma is generated using a medium-pressure (0.001 M to 0.1 MPa) plasma region (Region B), and not in Regions C or A described above. And generated radical particles are ejected into a low-pressure reaction chamber of not more than several hundreds of Pa, and are used in the film forming and etching processing of a substance to be treated on a treatment surface.

Concretely, in the apparatus shown in FIG. 1, with the discharge gap length (distance between the grounding electrode 1 and the dielectric body 3(and the dielectric body 10) set at 0.1 to several mm (for example, 2 mm) (see FIG. 3), a plasma is formed by generating a dielectric-barrier discharge in the discharge space part. The plasma electric field intensity at this time becomes several hundreds of Td to 1000 Td and a high-electric-field plasma is generated in the discharge space part. And a radical gas 15 having high energy is generated from this high-electric-field plasma, and the generated radical gas 15 is effectively supplied to the interior of the low-pressure CVD chamber. That is, in the apparatus for generating a dielectric-barrier discharge gas of the present invention, the ions and electrons generated in the discharge space part are bound by the electric field between short-gap electrodes and, therefore, this apparatus has a configuration for effectively generating and taking out a gas which is a radical gas 15 having no charge and contributes to the formation of a functional film in a semiconductor element.

The above-described configuration is realized by devising a plasma generation mechanism, a gas supply method, the flow direction of gas in the discharge space, and a plasma gas take-out mechanism. In the apparatus for generating a dielectric-barrier discharge gas of the present invention, the discharge gap length is shortened and the electrode surface is cooled, and also a plasma which lasts for a microtime with a microdischarge in the discharge space part is uniformly formed by use of a dielectric-barrier discharge. Furthermore, by use of this high-electric-field plasma, high-density, high-energy electrons, ion gas and radical gas 15 are generated and pressure differences between the inside and the outside of the discharge space part, the opening thereof, the gas ejection hole 14, and the main body 13, and the like are appropriately configured, whereby only a neutral radical gas 15 can be effectively taken to outside the main body 13.

Figure 4:
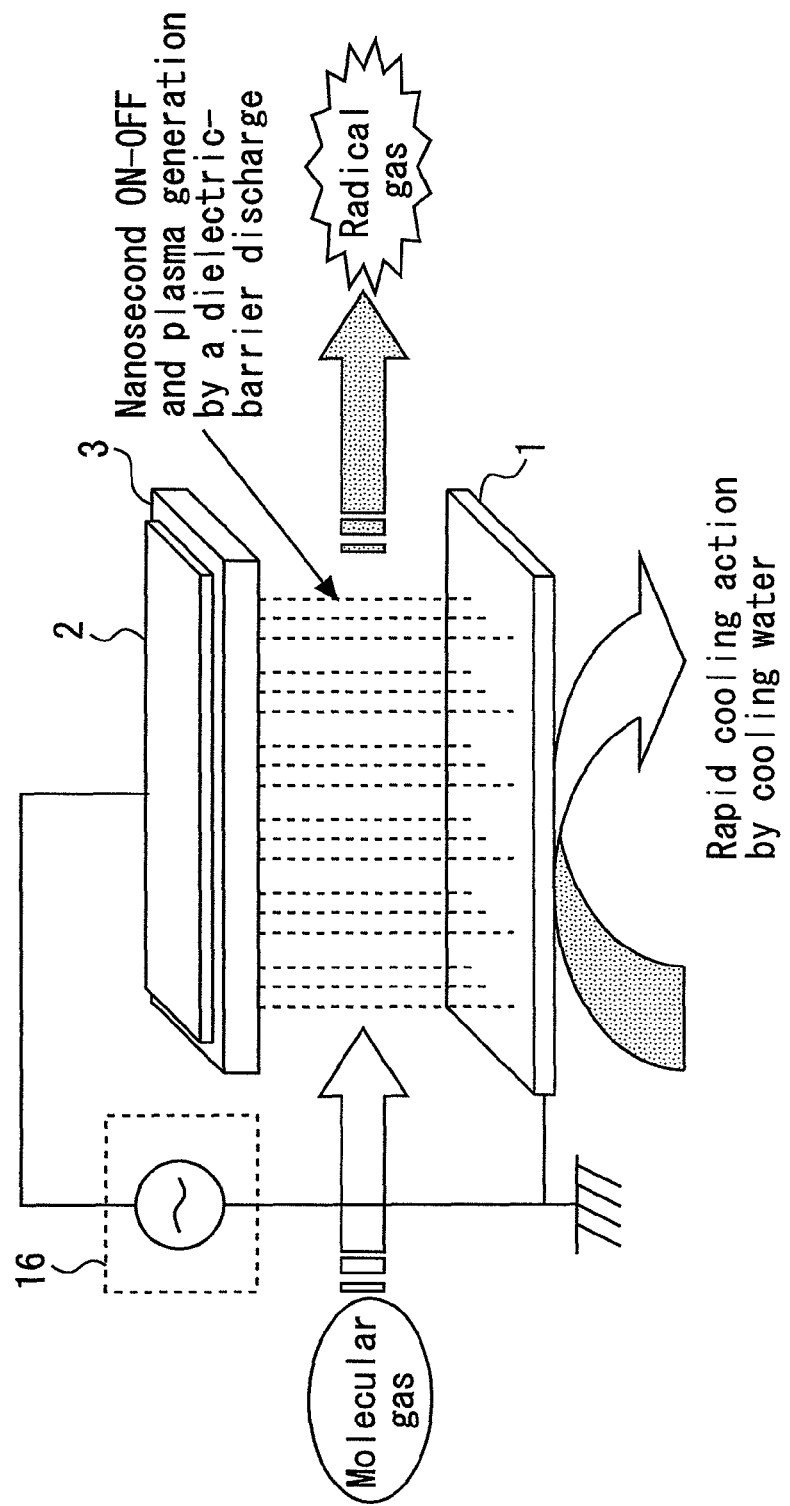
FIG. 4 is a diagram to explain the function of the apparatus for generating a dielectric-barrier discharge gas in First Embodiment according to the present invention.
Figure 5:
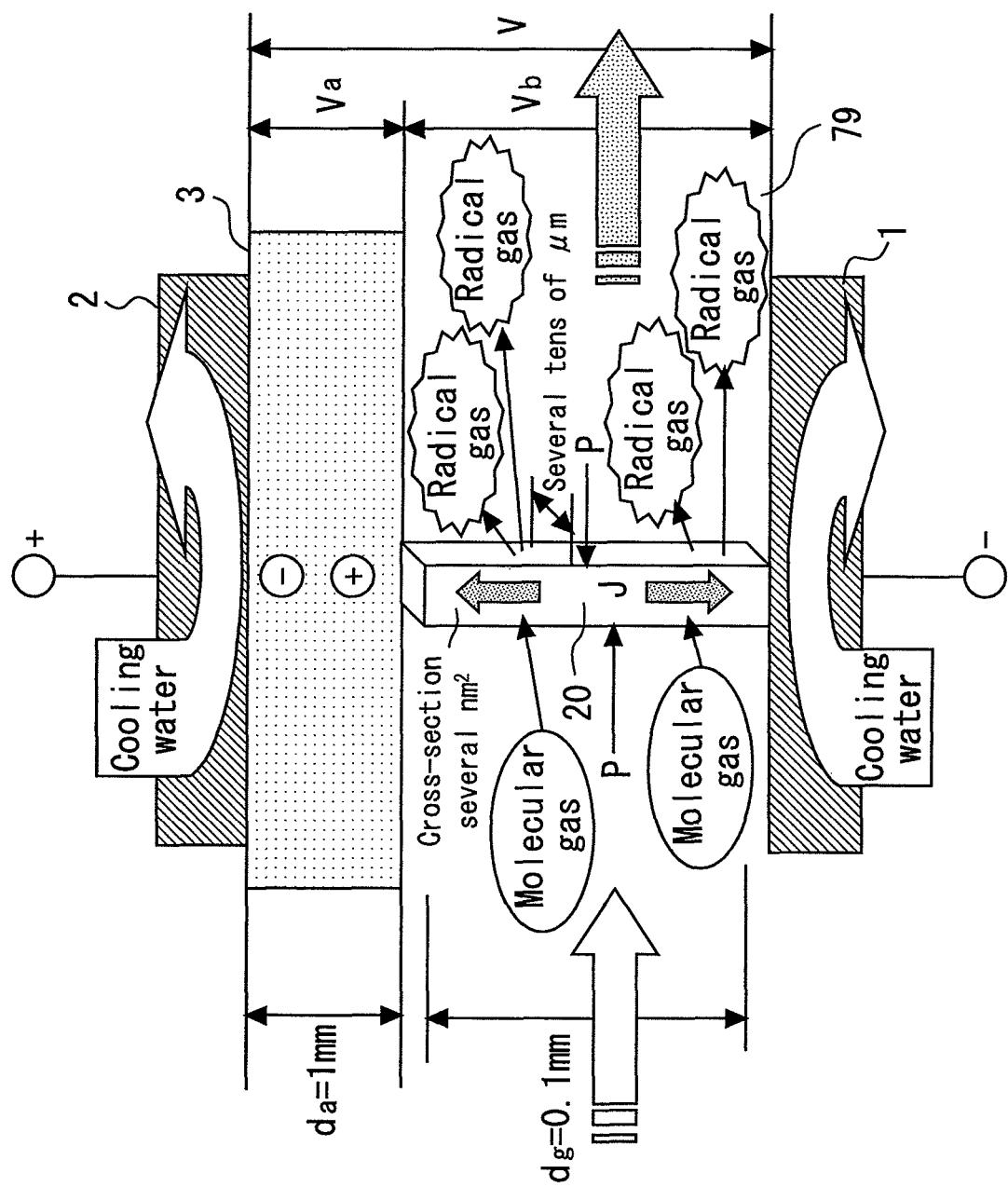
FIG. 5 is a diagram to explain the function of the apparatus for generating a dielectric-barrier discharge gas in First Embodiment according to the present invention.

FIGS. 4 and 5 are diagrams to explain the function of the apparatus for generating a dielectric-barrier discharge gas in First Embodiment according to the present invention. In the following, descriptions will be given of the discharge pattern and features of a dielectric-barrier discharge on the basis of FIG. 4 and the mechanism of a gas species generated by a plasma occurring in one of the microdischarges and features of the mechanism on the basis of FIGS. 4 and 5.

Figure 6:
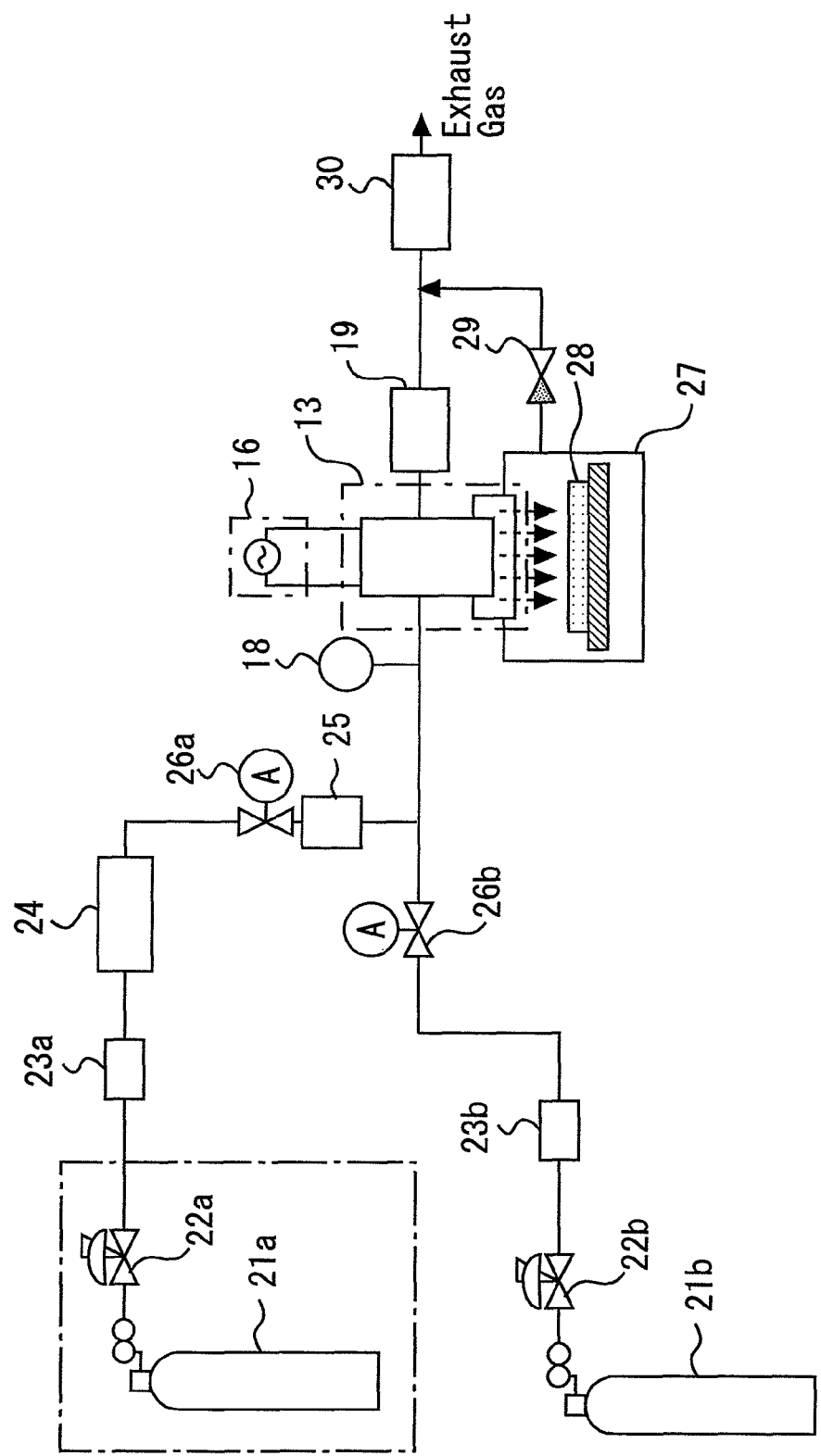
FIG. 6 is a block diagram showing the configuration of a thin film forming system in which the apparatus for generating a dielectric-barrier discharge gas of the present invention is used.

In FIGS. 4 and 5, the cooling water 7 is caused to flow through the interior of each of the grounding electrode 1 and the high-voltage electrode 2 which are arranged in an opposed manner, whereby one surface of each of the electrodes is cooled. When in this state an AC voltage is applied by the AC power source 16 across the grounding electrode 1 and the high-voltage electrode 2, with a 90-degree phase shift from the applied AC voltage, charges are polarized on both sides of the dielectric body 3 and induction occurs (FIG. 6 shows a schematic diagram of a case where a positive potential is applied to the high-voltage electrode 2).

That is, when an AC voltage V is applied across the grounding electrode 1 and the high-voltage electrode 2, a maximum polarization charge $Q_{max}$ is accumulated in the discharge space part at a point in time when the value of (dV/dt) becomes a maximum. That is, this means that a maximum electric field intensity $E_{max}$ is applied to the discharge space part with a discharge gap length $d_g$=0.1 mm. If the electric field intensity $E_c$ at which a dielectric breakdown occurs in the discharge space part is made smaller than $E_{max}$, then a partial dielectric breakdown occurs in a microportion of the discharge space part at a point in time of a polarization charge $Q_c$ when the electric field intensity $E_c$ is reached, and the polarization charge $Q_c$ accumulated in the dielectric body 3 is discharged in the grounding electrode 1 at a prescribed discharge voltage $V_j$. And when the polarization charge $Q_c$ disappears from the dielectric body 3, the discharge is stopped instantaneously and the above-described partial dielectric breakdown is recovered. When the dielectric body 3 is charged again after a discharge and the polarization charge $Q_c$ is reached, a partial dielectric breakdown occurs again. The discharge of a discharge voltage $V_j$ is repeated by the above-described phenomenon. Incidentally, an on-off discharge which repeats a partial dielectric breakdown (a discharge) and a dielectric recovery in the discharge space is called a dielectric-barrier discharge.

In the dielectric body 3, a charge is uniformly accumulated on the whole one surface opposed to one surface of the grounding electrode 1. For this reason, a dielectric-barrier discharge has the feature that the discharge occurs uniformly on the whole one surface of the dielectric body 3 in the discharge space part although the discharge is a disorderly on-off discharge. Also, a dielectric-barrier discharge has the feature that it is a microdischarge because it occurs due to a charge accumulated on a microsurface of the dielectric body 3 and that it is also a discharge which holds only for a short time. It is said that one discharge diameter of a dielectric-barrier discharge, which depends on the gas pressure P, gas temperature, gas species and the like in the discharge space part, is on the order of several tens of μm and that the discharge section of a dielectric-barrier discharge is on the order of several $nm^2$. The smaller the discharge gap length $d_g$ and the gas pressure P, the smaller the discharge impedance of the discharge space part, and the duration $T_g$ of one of the dielectric-barrier discharges is usually on the order of n seconds (nanoseconds) when the discharge gap length $d_g$=about 0.1 mm and the gas pressure P=about 0.1 MPa.

As described above, a dielectric-barrier discharge can be defined as the phenomenon that a microdischarge, which is a sustained discharge lasting for a very short time, is repeated infinitely and discontinuously in time and space. For this reason, a dielectric-barrier discharge has the feature that a dielectric-barrier discharge can realize a plasma having high electric field intensities which are several times to several tens of times those of a glow discharge and an arc discharge of a thermoelectronic emission mode, which are a sustained discharge lasting for a long time or a sustained discharge lasting continuously. Also, because a dielectric-barrier discharge is a charge due to a charge charged up in a dielectric body, in response to a voltage V applied from the outside, a charge is uniformly charged up on the electrode surface of the dielectric body. Therefore, even when individual discharges occur in a disorderly manner in time and space, the discharges occur stably when viewed in terms of the whole dielectric-barrier discharge group, and it is possible to easily form a uniform space. For this reason, a dielectric-barrier discharge has the feature that it is possible to realize a non-equilibrium plasma having high electron temperatures, which cannot be realized in a glow discharge and an arc discharge, which are sustained discharges, and that it is possible to realize a plasma state containing high-energy electrons and ion gas and a very active radical gas.

In the following, a description will be given of the mechanism of a dielectric-barrier discharge having the above-described features on the basis of FIG. 6. When a voltage V is applied across the grounding electrode 1 and the high-voltage electrode 2, a voltage-divided potential $V_a$ acts on both sides of the dielectric body 3 and a voltage-divided potential $V_b$ acts on both sides of the discharge space part. At the above-described discharge voltage $V_j$, an infinite number of discharges are repeated in an on-off manner short-time on the order of nsec. For this reason, the voltage $V_b$ applied to the discharge space part takes a value almost equivalent to the above-described discharge voltage $V_j$.

The electric field E of this discharge is expressed by the following expression.

$$E=V_b/(d \cdot n)[V \cdot cm^2] \qquad \text{[Expression 2]}$$

In this expression, n is the particle density ($1/cm^3$). The average free path 2 of particles in the space of this particle density n is expressed by $\lambda \propto 1/n$. For this reason, the lower the gas pressure of the discharge space part, the lower the frequency of collisions among particles, with the result that the giving and receiving of energy among particles decreases. Therefore, the number of electrons having high energy increases and also the number of ion particles and radical particles having high energy increases.

If a microdischarge occurs for a duration of $T_g$ (nsec) from a charge Q charged in a microspace on one surface of the dielectric body 3, then the discharge kinetic energy J generated by this one microdischarge is given by the following expression.

$$J=\Delta I \times V_j \times T_g [J] \qquad \text{[Expression 3]}$$

That is, for a microtime $T_g$, discharge kinetic energy of the order of several nJ is implanted into a microdischarge space column 20 in a concentrated manner. For this reason, in the microdischarge space 20, high-energy electrons accelerated by the electric field E collide against the particles in the plasma and high-energy particles (ion and radical particles) are generated.

Incidentally, for the microdischarge space 20 having the above-described high-energy particles, the gas in the interior is not heated because the discharge is stopped in a short time of the order of nsec and because the microdischarge space 20 is appropriately cooled by the cooling water 7 flowing through the two electrodes 1 and 2. For this reason, for the microdischarge space 20, the plasma state is maintained at room temperature. In such a plasma state at a low gas temperature, the thermal motion of high-energy particles obtained in the discharge period is suppressed and it is possible to reduce energy losses caused by collisions among particles due to this thermal motion. That is, as a result, it becomes possible to make many high-energy particles.

Because the discharge gap length of the discharge space part is very short (for example, $d_g$=0.1 mm) and a plasma is formed only in this discharge space part, almost all electrons and ion particles having a charge among the high-energy particles generated by a discharge are constrained by the electric field between the two electrodes 1 and 2 within the discharge space part. A small number of electrons and ion particles which have flown to outside the discharge space part are rebound with gas and neutralized before they are taken outside the main body 13. For this reason, it becomes possible to cause a high-energy radical gas 15 having no charge to be outputted at a high density and with a high efficiency, and it becomes possible to substantially reduce the proportion of electrons and ion particles having a charge compared to the conventional plasma generator.

The discharge space part has the shape of a rectangular parallelepiped which is defined by the grounding electrode 1, the dielectric body 3 and the spacer 4 and opens only in one side, shortens the discharge gap, thereby reducing the sectional area of the opening of the discharge space part (the sectional part of the gap). For this reason, it becomes possible to cause the high-speed radical gas 15 having directionality to be outputted from the opening of the discharge space part, and it is possible to cause the radical gas 15 to be jetted from the gas ejection hole 14 at a high density and with a high efficiency. Incidentally, the atmospheric pressure of the reaction chamber containing a substance to be treated is caused to be several hundreds of Pa, which are lower than the atmospheric pressure (1 k to 0.1 MPa) of the main body 13, whereby it becomes possible to take the radical gas 15 to outside the main body 13 at a higher density and with a higher efficiency by utilizing this pressure difference.

According to First Embodiment of the present invention, it becomes possible to take out the high-energy radical gas 15 at a high density and with a high efficiency and to supply this radical gas 15 to a substance to be treated.

In general, the higher the energy of high-energy particles (ion and radical particles) to be radiated onto a substance to be treated, the more a high active reaction can be expected for the substance to be treated. For this reason, in the semiconductor field, attention is paid to chemical reaction surfaces between the surface of the substance to be treated and high-energy particles, and there are required attractive radical gasses which can realize, for example, that oxide films and nitride films having unique characteristics, such as the capability to cause a crystal film excellent in the electrical, magnetic and optical properties in the substance to be treated to grow, are formed, that an etching action and annealing which have hitherto been incapable of being realized are made possible, that the film forming speed is improved, and the like.

Furthermore, in the semiconductor field, it is required that chemical reactions be caused to occur by a neutral radical gas, thereby making it possible to perform a selective surface modification. That is, electrons and ion particles having a charge are such that metal ion atoms are caused to migrate by the charging of electrons in the semiconductor surface and by the flow of an ion current, thereby causing damage (plasma damage) to the semiconductor.

According to the apparatus for generating a dielectric-barrier discharge gas of the present invention, unlike conventional microwave discharge devices, high-frequency discharge devices and low-pressure glow discharge devices, it is possible to take out only a neutral radical gas 15 at a high density and with a high efficiency without causing a plasma to strike directly against a substance to be treated. For this reason, it becomes possible to meet the above-described various requirements in the semiconductor field.

Second Embodiment

FIG. 6 is a block diagram showing the configuration of a thin film forming system in which the apparatus for generating a dielectric-barrier discharge gas of the present invention is used. In FIG. 6, reference numeral 21a denotes an oxygen cylinder; 21b denotes a nitrogen cylinder; 22a and 22b denote gas regulators; 23a and 23b denote mass flow controllers (MFCs) for raw material gas; 24 denotes an ozone generator; 25 denotes an automatic pressure controller (APC) for maintaining the pressure in the ozone generator 24 at a constant level; and 26a and 26b denote pneumatic valves for the on-off operation of ozone gas and nitrogen gas.

Reference numeral 27 denotes a reaction chamber in which a substance to be treated 28 (for example, a semiconductor wafer) is placed. The substance to be treated 28 in this reaction chamber 27 is arranged in such a manner that a treatment surface thereof is opposed to a gas ejection hole 14 formed in a main body 13. The reaction chamber 27 is provided with various kinds of equipment (not shown), such as a heating device for heating the substance to be treated 28, and a vacuum pump for adjusting the gas flow rate and the internal pressure. Incidentally, reference numeral 29 denotes an exhaust regulating valve and the reference numeral 30 denotes an exhaust gas decomposing device.

In the thin film forming system having the above-described configuration, first, oxygen gas is supplied from the oxygen cylinder 21a to the ozone generator 24 by adjusting the gas regulator 22a and ozone is generated. And the generated ozone gas is supplied to the interior of the main body 13, which is the apparatus for generating a dielectric-barrier discharge gas, i.e., into the discharge space part. At this time, the pressure in the main body 13 is held to a prescribed value (for example, 50 kPa) by an exhaust gas controller 19 and in this state a dielectric-barrier discharge is generated. And ozone gas is dissociated by a discharge and radical gas particles of oxygen atoms are generated. The radical gas particles generated in the discharge space part are ejected into the reaction chamber 27 from the gas ejection hole 14 due to a difference in the pressure in the main body 13 and the pressure in the reaction chamber 27. That is, the radical gas particles ejected from the gas ejection hole 14 strike against the treatment surface of the substance to be treated 28, an oxidation chemical reaction occurs on the treatment surface and an oxide film is formed.

After the formation of the oxide film on the substance to be treated 28, the pneumatic valve 26a is closed and the pneumatic valve 26b is opened. Then, the gas supplied to the interior of the main body 13 is changed from ozone gas to nitrogen gas and a nitrogen plasma is formed. Therefore, in the discharge space part, radical gas particles of nitrogen atoms are generated and by an action similar to that described above, nitrogen radical gas particles are ejected from the gas ejection hole 14. That is, a nitride film is formed by a nitriding chemical reaction on the oxide film formed on the substance to be treated 28. In the foregoing, the description was given of the case where two kinds of raw material gasses are supplied in a time series manner and an oxide film and a nitride film are formed. However, film formation may be performed by simultaneously supplying a plurality of raw material gasses.

According to Second Embodiment of the present invention, the main body 13 is provided in proximity to the reaction chamber 27 in which the substance to be treated 28 is placed and it is possible to cause the generated radical gas to be jetted like a shower onto the above-described substance to be treated 28 by the differential pressure of the main body 13 and the reaction chamber 27. Therefore, it becomes possible to form a good-quality oxide film and nitride film.

Because the raw material gas supplied to the main body 13 can be easily switched from ozone gas (oxygen gas) to nitrogen gas by opening and closing the pneumatic valves 26a and 26b, it is possible to easily form an oxide film and a nitride film in layers. Furthermore, by making the pressure in the main body 13 and the AC voltage value, current value and frequency applied across the electrodes 1 and 2 variable, it is possible to generate an optimum discharge plasma suited to the raw material gas species. For this reason, it is possible to obtain various kinds of effects without changing the pressure in the reaction chamber 27 and the temperature of the substance to be treated 28. That is, it is possible to effectively jet radical particles on the treatment surface of the substance to be treated 28, and good-quality film formation can be expected. Film formation at low temperatures becomes possible and it becomes also possible to raise the film forming speed.

Incidentally, in Second Embodiment, the description was given of the case where ozone gas (oxygen gas) and nitrogen gas are used as raw material gasses for the formation of an oxide film and a nitride film. However, it is also possible to use various kinds of raw material gasses according to the function imparted to the substance to be treated 28. For example, a fluorine radical gas and a hydrogen radical gas may also be generated by a discharge by use of the present apparatus by adopting fluorine gas, a fluorine compound gas or hydrogen gas and a hydrogen compound gas as the raw material gas. In such a case, it becomes possible to effectively etch the treatment surface of the substance to be treated 28.

It is also possible to perform high-quality annealing on the treatment surface of the substance to be treated 28 by generating a radical gas that is a rare gas by a discharge by use of the present apparatus through the adoption of a rare gas, such as argon gas, as the raw material gas. Although a radical gas that is a rare gas does not cause a chemical reaction to occur, it becomes possible to perform the heat treatment of the above-described treatment surface of the substance to be treated 28 by causing a radical gas that is a rare gas having high energy to strike against the above-described treatment surface.

Third Embodiment

Figure 7:
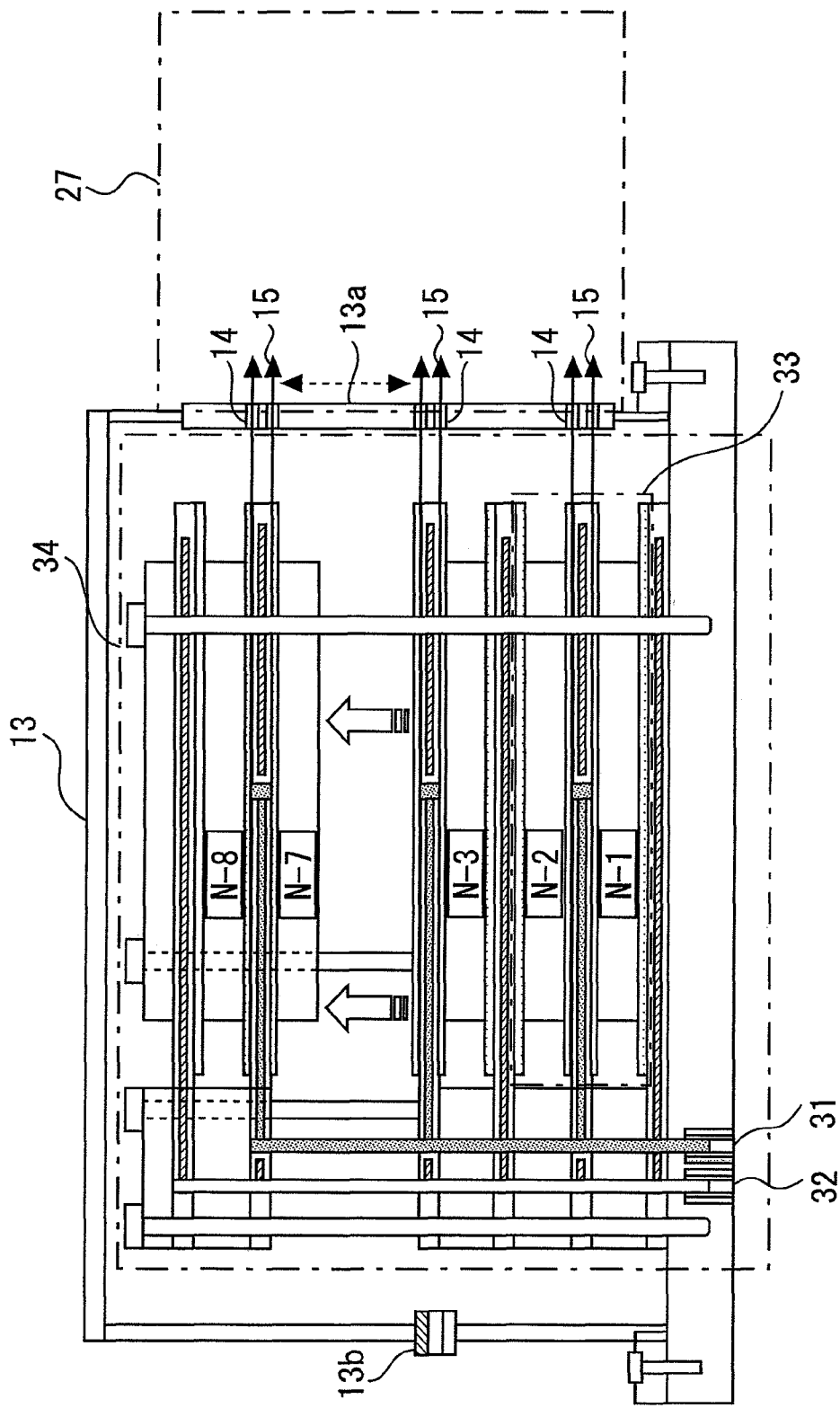
FIG. 7 is a block diagram showing an apparatus for generating a dielectric-barrier discharge gas in Third Embodiment according to the present invention.
Figure 8:
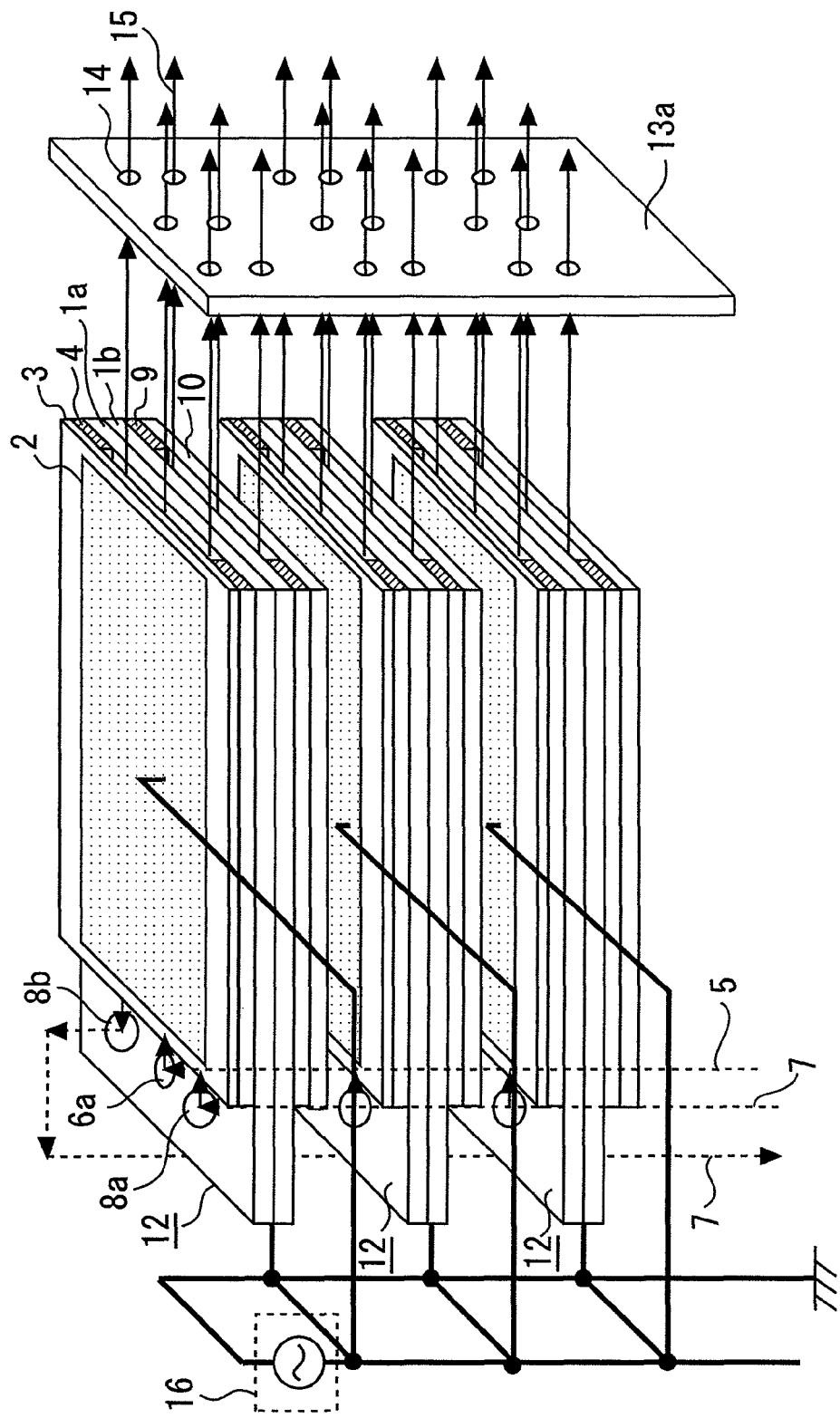
FIG. 8 is a partial perspective view of the apparatus for generating a dielectric-barrier discharge gas in Third Embodiment according to the present invention.

FIG. 7 is a block diagram showing an apparatus for generating a dielectric-barrier discharge gas in Third Embodiment according to the present invention, and FIG. 8 is a partial perspective view of the apparatus for generating a dielectric-barrier discharge gas in Third Embodiment according to the present invention. In FIGS. 7 and 8, reference numeral 31 denotes an inlet of a raw material gas 5 formed in a main body 13; 32 denotes an inlet of cooling water 7 formed in the main body 13; 33 denotes an electrode cell; and 34 denotes an electrode stack module.

In the apparatus for generating a dielectric-barrier discharge gas shown in FIGS. 7 and 8, the discharge cell 12 is stacked in a plurality of layers within the main body 13 and an AC power source 16 is connected in parallel to each of the discharge cells 12. This configuration enables a high-energy radical gas to be jetted in a planar manner from one side wall 13a of the main body 13. That is, because each discharge space part has only a thickness for a spacer 4, a plurality of gas ejection holes 14 are arranged only linearly for one discharge space part. Hence, the gas ejection holes 14 are two-dimensionally formed by stacking discharge cells 12 in a direction orthogonal to the longitudinal direction of the opening of the discharge space part. This configuration enables a radical gas to be ejected from a prescribed range of the one side wall 13a of the main body 13.

According to Third Embodiment of the present invention, the discharge cells 12 are stacked in multiple layers and the gas ejection holes 14 are formed in a manner corresponding to the opening of the discharge space part of each of the discharge cells 12, whereby it becomes possible to increase the flow rate and concentration of a radical gas ejected into the reaction chamber 27. Also, because a radical gas can be jetted in a planer manner, it becomes also possible to form a uniform oxide film on the treatment surface of a substance to be treated 28 having a prescribed area.

Incidentally, the apparatus for generating a dielectric-barrier discharge gas of the present invention was described with the aid of an apparatus in which a dielectric body is mounted on one electrode surface in the discharge space. However, as a matter of course, similar effects are produced even when the dielectric body is mounted on both of two electrode surfaces.

INDUSTRIAL APPLICABILITY

As described above, according to the apparatus for generating a dielectric-barrier discharge gas according to the present invention, it becomes possible to take out a high-energy radical gas at a high density and with a high efficiency and to supply the radical gas to a substance to be treated.

Therefore, the present invention is favorably utilized for forming a thin film on a wafer surface in manufacturing semiconductors and for etching and annealing processes. Also, the present invention can be used for the formation of a thin film on a flat panel surface of a liquid crystal, a solar cell and the like, and etching and annealing processes. Furthermore, the present invention is also applicable to metal surface treatment, which is frequently used in the industrial field, in an environmentally-friendly manner. That is, it is possible to prevent the corrosion of a metal surface from propagating by forming an oxide film and a nitride film on the surface of a metal part.

The invention claimed is:
1. An apparatus for generating gaseous plasma species for treating an object, the apparatus comprising:
a discharge cell including:
a generally planar first electrode having opposed first and second surfaces that are generally planar, wherein the first electrode includes
a coolant inlet, a coolant outlet, and a coolant channel within the first electrode and connecting the coolant inlet to the coolant outlet for circulation of a coolant within the first electrode for cooling of the first electrode, and
a gas inlet, a gas outlet, and a gas channel within the first electrode and connecting the gas inlet to the gas outlet;
a generally planar second electrode having opposed first and second surfaces that are generally planar, wherein the first surface of the first electrode is disposed opposite and spaced from the first surface of the second electrode;

a first dielectric body located on and covering the first surface of the second electrode and spaced from the first surface of the first electrode; and a first dielectric spacer positioned between and in contact with only part of the first surface of the first electrode and the first dielectric body, and defining a first discharge space between the first surface of the first electrode and the first dielectric body, and that is partially enclosed by the first dielectric spacer, wherein the gas outlet opens at the first surface of the first electrode within the first discharge space for supplying a raw material gas to the first discharge space, the first dielectric spacer has an opening only at a first end so that only the first discharge space is open at a first end of the first electrode and at the first end of the first dielectric body, the gas inlet, the coolant inlet, and the coolant outlet are located proximate a second end of the first electrode, the second end of the first electrode is opposite in position from the first end of the first electrode, the gas outlet is located between the first and second ends of the first electrode, and the second end is not covered at the first surface and the second surface of the first electrode by the first dielectric body and the first dielectric spacer, and the first surface of the first electrode and the first dielectric body are separated by a first gap in the first discharge space;

a gas supply supplying the raw material gas to the first discharge space through the gas inlet and the gas outlet;

an AC power source connected across the first and second electrodes of the discharge cell for generating a dielectric-barrier discharge in the raw material gas in the first discharge space and producing the gaseous plasma species that escape from the first discharge space of the discharge cell at the opening in the first dielectric spacer at the first end of the first electrode and the first end of the first dielectric body; and a main body which encloses the discharge cell, wherein the main body includes a side wall that is transverse to the first and second electrodes and located proximate the first end of the first electrode and the first end of the first dielectric body, and a plurality of gas ejection holes in the side wall, located directly opposite the first end of the first electrode and the first end of the first dielectric body for ejecting, outside the main body, the gaseous plasma species that are ejected from the first discharge space of the discharge cell.

2. The apparatus according to claim 1, further comprising:
a gas pressure detector for detecting gas pressure within the main body;
an exhaust pipe connected through a wall, other than the side wall, of the main body, for exhausting gas from within the main body; and
an exhaust gas controller which controls flow rate of gas being exhausted from the main body in response to the gas pressure detected by the gas pressure detector and which maintains the gas pressure within the main body constant and higher than pressure outside the main body.

3. The apparatus according to claim 1, wherein
the first gap between the first surface of the first electrode and the first dielectric body in the first discharge space is in a range from 0.1 mm to 2.0 mm, and
the gas pressure in the first discharge space is in a range from 1.0 kPa to 0.1 MPa.

4. The apparatus according to claim 1, wherein the gas supply supplies a gas selected from the group consisting of oxygen, nitrogen, an oxidizing gas, a gaseous nitrogen compound, and a gaseous fluoride compound, as the raw material gas, to the first discharge space.

5. The apparatus according to claim 1, comprising a plurality of the discharge cells stacked in a direction orthogonal to the first and second surfaces of the first electrodes of the discharge cells.

6. The apparatus according to claim 1, wherein the first dielectric spacer shields the first discharge space, other than at the first end of the first electrode and other than at the first end of the first dielectric body, from intrusion of gas.

7. An apparatus for generating gaseous plasma species for treating an object, the apparatus comprising:
a discharge cell including:
a generally planar first electrode having opposed first and second surfaces that are generally planar, wherein the first electrode includes
a coolant inlet, a coolant outlet, and a coolant channel within the first electrode and connecting the coolant inlet to the coolant outlet for circulation of a coolant within the first electrode for cooling of the first electrode, and
a gas inlet, a first gas outlet, and a gas channel within the first electrode and connecting the gas inlet to the first gas outlet;
a generally planar second electrode having opposed first and second surfaces that are generally planar, wherein the first surface of the first electrode is disposed opposite and spaced from the first surface of the second electrode;
a first dielectric body located on and covering the first surface of the second electrode and spaced from the first surface of the first electrode; and
a first dielectric spacer positioned between and in contact with only part of the first surface of the first electrode and the first dielectric body, and defining a first discharge space between the first surface of the first electrode and the first dielectric body, and that is partially enclosed by the first dielectric spacer, wherein the first gas outlet opens at the first surface of the first electrode within the first discharge space for supplying a raw material gas to the first discharge space, the first dielectric spacer has an opening only at a first end so that the first discharge space is only open at a first end of the first electrode and at the first end of the first dielectric body, the gas inlet, the coolant inlet, and the coolant outlet are located proximate a second end of the first electrode, the second end of the first electrode is opposite in position from the first end of the first electrode, the first gas outlet is located between the first and second ends of the first electrode, and the second end is not covered at the first surface and the second surface of the first electrode by the first dielectric body and the first dielectric spacer, and the first surface of the first electrode and the first dielectric body are separated by a first gap in the first discharge space;
a gas supply supplying the raw material gas to the first discharge space through the gas inlet and the first gas outlet;
an AC power source connected across the first and second electrodes of the discharge cell for generating a dielectric-barrier discharge in the raw material gas in the first discharge space and producing the gaseous plasma species that escape from the first discharge space of the discharge cell at the opening in the first dielectric spacer at the first end of the first electrode and the first end of the first dielectric body, wherein the discharge cell further includes:
a generally planar third electrode having opposed first and second surfaces that are generally planar, wherein the first surface of the third electrode is disposed opposite and spaced from the second surface of the first electrode,
the first electrode includes a second gas outlet and the gas channel within the first electrode connects the gas inlet to the second gas outlet;
a second dielectric body located on and covering the first surface of the third electrode and spaced from the second surface of the first electrode; and
a second dielectric spacer positioned between and in contact with only part of the second surface of the first electrode and the second dielectric body, and defining a second discharge space between the second surface of the first electrode and the second dielectric body and that is partially enclosed by the second dielectric spacer, wherein
the second gas outlet opens at the second surface of the first electrode within the second discharge space for supplying the raw material gas to the second discharge space,
the second dielectric spacer has an opening only at a first end of the second dielectric spacer so that the second discharge space is open only at the first end of the first electrode and at a first end of the second dielectric body,
the second dielectric body and the second dielectric spacer are not disposed opposite and do not cover the second end of the first electrode where the gas inlet, the coolant inlet, and the coolant outlet are located, and the second gas outlet is located between the first and second ends of the first electrode,
the second surface of the first electrode and the second dielectric body are separated by a second gap in the second discharge space;
the gas supply supplies the raw material gas to the second discharge space of the discharge cell through the gas inlet and the second gas outlet, and the AC power source is connected across the first and third electrodes for generating a dielectric-barrier discharge in the raw material gas in the second discharge space and producing the gaseous plasma species that escape from the first discharge space of the discharge cell at the opening in the second dielectric spacer at the first end of the first electrode and the first end of the second dielectric body; and
a main body which encloses the discharge cell, wherein the maim body includes
a first wall that is transverse to the first electrode and the second electrode and proximate the first end of the first electrode and the first ends of the first and second dielectric bodies, and
a plurality of gas ejection holes in the side wall, located directly opposite the first end of the first electrode and the first ends of the first and second dielectric bodies for ejecting, outside the main body, the gaseous plasma species that are ejected from the first and second discharge spaces of the discharge cell.

8. The apparatus according to claim 7, further comprising:
a gas pressure detector for detecting gas pressure within the main body;
an exhaust pipe connected through a wall, other than the side wall, of the main body, for exhausting gas from within the main body; and
an exhaust gas controller which controls flow rate of gas being exhausted from the main body in response to the gas pressure detected by the gas pressure detector and which maintains the gas pressure within the main body constant and higher than pressure outside the main body.

9. The apparatus according to claim 7, wherein
the first gap between the first surface of the first electrode and the first dielectric body in the first discharge space and the second gap between the second surface of the first electrode and the first surface of the third electrode are in a range from 0.1 mm to 2.0 mm, and
the gas pressure in the first and second discharge spaces is in a range from 1.0 kPa to 0.1 MPa.

10. The apparatus according to claim 7, wherein the gas supply supplies a gas selected from the group consisting of oxygen, nitrogen, an oxidizing gas, a gaseous nitrogen compound, and a gaseous fluoride compound, as the raw material gas to the first and second discharge spaces.

11. The apparatus according to claim 7, comprising a plurality of the discharge cells stacked in a direction orthogonal to the first and second surfaces of the first electrodes of the discharge cells.

12. The apparatus according to claim 7, wherein the first and second dielectric spacers respectively shield the first and second discharge spaces, other than at the first end of the first electrode and other than at the first ends of the first and second dielectric bodies, from intrusion of gas.

* * * * *